US006465814B2

United States Patent

(12) United States Patent
Kasahara et al.
(10) Patent No.: US 6,465,814 B2
(45) Date of Patent: Oct. 15, 2002

(54) SEMICONDUCTOR DEVICE

(75) Inventors: Kensuke Kasahara; Yasuo Ohno; Masaaki Kuzuhara; Hironobu Miyamoto; Yuji Ando; Tatsuo Nakayama; Kazuaki Kunihiro; Nobuyuki Hayama; Yuji Takahashi; Kouji Matsunaga, all of Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/891,419

(22) Filed: Jun. 27, 2001

(65) Prior Publication Data

US 2002/0017648 A1 Feb. 14, 2002

(30) Foreign Application Priority Data

Jun. 29, 2000 (JP) ....................................... 2000-196751

(51) Int. Cl.[7] ..................... H01L 31/072; H01L 31/109; H01L 31/0328; H01L 31/0336

(52) U.S. Cl. ......................... 257/192; 257/194; 257/27; 257/20; 257/96

(58) Field of Search ................................ 257/365, 192, 257/280, 281, 194, 27, 29, 20, 96, 101, 458

(56) References Cited

U.S. PATENT DOCUMENTS

| | | | | | |
|---|---|---|---|---|---|
| 4,764,796 | A | * | 8/1988 | Sasaki et al. | 257/22 |
| 5,099,295 | A | * | 3/1992 | Ogawa | 257/22 |
| 5,192,987 | A | | 3/1993 | Khan et al. | |
| 5,670,798 | A | * | 9/1997 | Schetzina | 257/96 |
| 5,677,553 | A | * | 10/1997 | Yamamoto et al. | 257/192 |
| 5,929,467 | A | * | 7/1999 | Kawai et al. | 257/192 |
| 6,064,082 | A | * | 5/2000 | Kawai et al. | 257/192 |
| 6,114,732 | A | * | 9/2000 | Sugimura et al. | 257/365 |

FOREIGN PATENT DOCUMENTS

| | | |
|---|---|---|
| JP | 10-294452 | 11/1998 |
| JP | 10-335637 | 12/1998 |
| JP | 11-261051 | 9/1999 |
| JP | 11-261053 | 9/1999 |
| JP | 11-274474 | 10/1999 |
| JP | 11-297713 | 10/1999 |

* cited by examiner

*Primary Examiner*—David Nelms
*Assistant Examiner*—Andy Huynh
(74) *Attorney, Agent, or Firm*—McGinn & Gibb, PLLC

(57) ABSTRACT

A semiconductor device of the present invention comprises $Al_{0.3}Ga_{0.7}N$ layer 4 and $Al_{0.1}Ga_{0.9}N$ layer 5 having different Al contents as an electron supply layer on GaN layer 6 serving as an active layer. An area where $Al_{0.3}Ga_{0.7}N$ layer 4 is formed is used as a low resistance area, while an area where $Al_{0.1}Ga_{0.9}N$ layer 5 is formed is used as a high resistance area. As a result, a distribution of two-dimensional electrons serving as carriers is produced within a horizontal plane perpendicular to the thickness direction of the layers to form a desired device configuration. For example, when the configuration is applied to a transistor configuration, a channel concentration under a gate is reduced to improve withstand voltage between the gate and a drain, and at the same time, a channel concentration in source and drain areas is increased to realize low contact resistance.

24 Claims, 7 Drawing Sheets

1 SOURCE ELECTRODE
2 GATE ELECTRODE
3 DRAIN ELECTRODE
4 $Al_XGa_{1-X}N$ (X=0.3)
5 $Al_XGa_{1-X}N$ (X=0.1)
n- n- n-
6 GaN
7 SiC SUBSTRATE
(c) (d)

SEMICONDUCTOR DEVICE

BACKGROUND OF THE INVENTION

1. Field of the Invention

The present invention relates to a semiconductor device comprising an active layer and an electron supply layer and utilizing a two-dimensional electron gas produced in an interface between the layers.

2. Description of the Related Art

AlGaN/GaN HJFETs are considered as promising devices with high power and high withstand voltage. A conventional AlGaN/GaN HJFET has a configuration in which a plurality of gallium nitride group semiconductor layers are stacked on a substrate, for example as disclosed in U.S. Pat. No. 5,192,987 by M. A. Khan. Each semiconductor layer has uniform composition in a horizontal plane perpendicular to the thickness direction of the layers.

In semiconductor devices of this kind, one of important considerations is to simultaneously realize high withstand voltage between a gate and a drain and a higher current density in an active layer, and an electrode of low contact resistance. To this end, it is necessary to vary distribution of carriers in a channel layer and a surface layer within a plane to increase withstand voltage between a gate and drain by reducing a channel concentration in an area under the gate or between the gate and drain and to realize low contact resistance by increasing a channel concentration in source and drain areas. For this purpose, conventionally, an area in a low carrier concentration and an area in a high carrier concentration are separately formed by performing ion implantation to partially change a dose, or areas in different carrier concentrations are separately formed by stacking layers in different carrier concentrations and then recess-etching a portion of the layers. For example, in AlGaAs/GaAs, GaAs doped in high concentration is formed on a surface to form an ohmic electrode, and the heavily doped area is partially removed to form a gate electrode.

In AlGaN/GaN, however, when a heterojunction is formed on a (0001) surface, more carriers are induced with a piezo effect and a spontaneous polarization effect than with a doping concentration. Even when layers in different doping concentrations are formed and a portion thereof is removed, the effect of providing a difference in electron concentration within a plane is not produced sufficiently. The piezo effect is determined by the composition of stacked layers, and induced carriers depend on the thickness of the layer if it is smaller than a critical thickness at which dislocation occurs. Thus, while an effect can be obtained to some extent by partially removing a uniform film through recess-etching, the effect is insufficient to form a greater difference in carrier concentration. In addition, a large difference in thickness is required to obtain a large difference in concentration, which makes it difficult to achieve a reduced difference in height.

On the other hand, it is known that gallium nitride semiconductor materials typically have a low activation rate from ion implantation, and thus contact resistance tends to be high. To address such a problem, J. Burm et al. have reported a configuration in which AlGaN having uniform composition in an AlGaN/GaN HJFET is recess-etched in Solid-State Electronics Vol.41, No.2, pp247, 1997. This configuration provides a small reduction in contact resistance and achieves a tolerable effect, although it is difficult to obtain a currently desired level of low contact resistance. While a configuration including a heavily doped GaAs cap layer formed on a surface of AlGaAs is employed in the GaAs group, this results in an increase in contact resistance conversely due to piezo charge in the AlGaN/GaN group.

SUMMARY OF THE INVENTION

The present invention has been made in view of the aforementioned circumstances, and it is an object of the present invention to produce a distribution of two-dimensional electrons serving as carriers in a horizontal plane perpendicular to a thickness direction of layers to form a desired device configuration. Specifically, when the present invention is applied to a transistor configuration, the present invention intends to improve withstand voltage between a gate and a drain by reducing a channel concentration under the gate and to realize low contact resistance by increasing a channel concentration in source and drain areas. When the present invention is applied to a monolithic microwave integrated circuit, the present invention intends to form a higher resistance element and a lower resistance element separately with simple steps and good controllability.

According to the present invention, provided is a semiconductor device comprising an active layer, and an electron supply layer in which induced charge including piezo charge is produced, the active layer and the electron supply layer being stacked in this order and having an interface between them at which a two-dimensional electron gas is formed, wherein the induced charge has a distribution within a horizontal plane perpendicular to the thickness direction of the layers and a distribution of two-dimensional electron concentrations is formed within the horizontal plane in accordance with the distribution of the induced charge.

With the semiconductor device, since the distribution of two-dimensional electron concentrations is formed in accordance with the distribution of the induced charge including piezo charge within the horizontal plane, it is possible to form an area of high channel resistance and an area of low channel resistance with good controllability. The induced charge includes both charge due to piezo polarization and charge due to spontaneous polarization. To produce such induced charge significantly, both active layer and electron supply layer are preferably formed of a group III nitride semiconductor. A crystal growth surface in this case is preferably a (0001) surface. It should be noted that, in this specification, the (0001) surface in group III nitride semiconductor crystal refers to a hatched surface in an arrangement shown in FIG. 3.

The semiconductor device may be configured such that a first area having a relatively low two-dimensional electron concentration is formed under a gate electrode and a second area having a relatively high two-dimensional electron concentration is formed under a source electrode, under a drain electrode, between the gate electrode and the drain electrode, or between the gate electrode and the source electrode. When such a configuration is used, a channel concentration under a gate is reduced to improve withstand voltage between the gate and a drain, while a channel concentration in source and drain areas is increased to realize low contact resistance. The first area may be formed in at least a portion of a region under the gate electrode, and the second area may be formed in at least a portion of the aforementioned regions. For example, the second area may be formed only in a portion of a region under the source electrode. It is preferable, however, that the second area is provided for each of the source and drain sides to allow a reduction in both source electrode resistance and drain electrode resistance. As an example of preferred arrangements of the first and second areas, the first area is formed under the gate electrode and in an area closer to the gate electrode between the gate and drain, and the second area is formed in an area where the first area is not formed between the source and drain and under each of the source and drain electrodes.

The semiconductor device may be configured such that the area having a relatively low two-dimensional electron concentration is used as a higher resistance element, and the area having a relatively high two-dimensional electron concentration is used as a lower resistance element. When such a configuration is used, the higher resistance element and lower resistance element can be formed separately with simple steps and good controllability. In the present invention, "a relatively low two-dimensional electron concentration" refers to a two-dimensional electron concentration lower than a two-dimensional electron concentration in the area used as the lower resistance element, while "a relatively high two-dimensional electron concentration" refers to a two-dimensional electron concentration higher than the two-dimensional electron concentration in the area used as the higher resistance element.

According to the present invention, provided is a semiconductor device comprising an active layer, and an electron supply layer formed in contact with an upper portion of the active layer and having tensile strain, wherein the active layer is made of $In_xGa_{1-x}N$ ($1 \geqq X \geqq 0$) and the electron supply layer is formed of a plurality of AlGaN layers having different average Al contents in contact with the upper portion of the active layer.

With the semiconductor device, the plurality of AlGaN layers having different average Al contents can preferably produce a distribution of induced charge including piezo charge within a horizontal plane, and a distribution of two-dimensional electron concentration is formed in accordance with the distribution. It is thus possible to form an area of high channel concentration and an area of low channel concentration with good controllability.

The semiconductor device may be configured such that an Al content of one or two or more layers of the plurality of AlGaN layers increases with distance from the active layer. This configuration enables a more significant distribution of induced charge within the horizontal plane to produce a significant distribution of two-dimensional electron concentrations.

The semiconductor device may be configured to further comprise a gate electrode, and a source electrode and a drain electrode formed on both sides of the gate electrode, wherein the gate electrode is formed in contact with one of the plurality of AlGaN layers, and the other layers having a higher Al content than the one layer are disposed between the gate electrode and the drain electrode and between the gate electrode and the source electrode. With such a configuration, a channel concentration under a gate can be reduced to improve withstand voltage between the gate and a drain, while a channel concentration in source and drain areas can be increased to realize low contact resistance.

The semiconductor device may be configured such that an area where a layer of the plurality of AlGaN layers having a relatively low Al content is formed is used as a higher resistance element and an area where a layer of the plurality of AlGaN layers having a relatively high AL content is formed is used as a lower resistance element. In this manner, the higher resistance element and lower resistance element can be separately formed with simple steps and good controllability. In the present invention, "a relatively low Al content" refers to an Al content lower than the Al content in the area used as the lower resistance element, while "a relatively high Al content" refers to an Al content higher than the Al content in the area used as the higher resistance element.

According to the present invention, provided is a semiconductor device comprising an active layer, an electron supply layer formed in contact with an upper portion of the active layer and having tensile strain, and a strain layer formed in contact with a part of an upper portion of the electron supply layer and having tensile strain, the active layer being made of $In_xGa_{1-x}N$ ($1 \geqq X \geqq 0$), the electron supply layer being made of $Al_yGa_{1-x}N\ _yN$ ($Y \geqq 0$), and the strain layer being made of $Al_zGa_{1-z}N$ ($1 \geqq Z > Y$).

In the semiconductor device, the strain layer has a higher Al content and a greater tensile strain than the electron supply layer. In an area where the strain layer is formed, large induced charge is produced due to piezo polarization and spontaneous polarization, and in accordance with this, a two-dimensional electron concentration is remarkably increased. Thus, an area of high channel resistance and an area of low channel resistance can be formed with good controllability, and additionally, a large difference in resistance can be obtained.

The semiconductor device may be configured such that an Al content in the electron supply layer or strain layer increase with distance from the active layer. This can produce a more significant distribution of induced charge within a horizontal plane to result in a significant distribution of two-dimensional electron concentrations.

The semiconductor device may be configured to comprise a gate electrode, and a source electrode and a drain electrode formed on both sides of the gate electrode, wherein the gate electrode is formed in contact with the electron supply layer and the strain layer is disposed between the gate electrode and the drain electrode and between the gate electrode and the source electrode. With such a configuration, a channel concentration under a gate or in an area between the gate and a drain can be reduced to improve withstand voltage between the gate and drain, while a channel concentration in source and drain areas can be increased to improve low contact resistance. If the strain layer is formed in contact with the source electrode and drain electrode when the configuration is employed, a low resistance area under the strain layer is close to the source electrode and drain electrode to allow a further reduction in contact resistance. When the gate electrode is formed to extend on the strain layer, concentration of electric fields can be alleviated between the gate and drain and a voltage withstanding characteristic can be improved.

The semiconductor device may be configured such that an area where the strain layer is disposed is used as a lower resistance element and an area where the strain layer is not disposed is used as a higher resistance element. In this manner, the higher resistance element and lower resistance element can be separately formed with simple steps and good controllability.

According to the present invention, provided is a semiconductor device comprising an active layer, and an electron supply layer formed in contact with an upper portion of the active layer and having tensile strain, wherein an Al content in the electron supply layer increases with distance from the active layer, a first area having a relatively low Al content is formed at an upper surface of the electron supply layer, and a second area having a relatively high Al content is formed at an upper surface of the electron supply layer.

An example of such a semiconductor device is one obtained by forming a layer having a uniformly increasing Al content and then etching a portion thereof to form a recess (see FIG. 13 and the like). In the present invention, "a relatively low Al content" refers to an Al content lower than the Al content in the area used as the lower resistance element, while "a relatively high Al content" refers to an Al content higher than the Al content in the area used as the higher resistance element. In the semiconductor device, the second area has a greater tensile strain than the first area. For this reason, in the second area, large induced charge is produced due to piezo polarization and spontaneous polarization, and in accordance with this, a two-dimensional electron concentration is remarkably increased. It is thus possible to form an area of high channel resistance and an area of low channel resistance with good controllability, and moreover, a large difference in resistance can be obtained.

The semiconductor device may be configured to comprise a gate electrode, and a source electrode and a drain electrode formed on both sides of the gate electrode, wherein the gate electrode is formed in contact with the first area and the second area is formed under the source electrode, under the drain electrode, between the gate electrode and the drain electrode, or between the gate electrode and the source electrode. With such a configuration, a channel concentration under a gate can be reduced to improve withstand voltage between the gate and a drain, while a channel concentration in source and drain areas can be increased to realize low contact resistance. The first may be formed in at least a portion of a region under the gate electrode, and the second area may be formed in at least a portion of the aforementioned regions. For example, the second area may be formed only in a portion of a region under the source electrode. It is preferable, however, that the second area is provided for each of the source and drain sides to allow a reduction in both source electrode resistance and drain electrode resistance. As an example of preferred arrangements of the first and second areas, the first area is formed under the gate electrode and in an area closer to the gate electrode between the gate and drain, and the second area is formed in an area where the first area is not formed between the source and drain and under each of the source and drain electrodes.

The semiconductor device may be configured such that the first area is used as a higher resistance element and the second area is used as a lower resistance element. In this manner, the higher resistance element and lower resistance element can be separately formed with simple steps and good controllability.

When each of the aforementioned semiconductor devices is provided with the gate electrode and drain electrode, a second gate electrode may be provided between them. This can alleviate concentration of electric fields between the gate and drain and improve a voltage withstanding characteristic.

The effects of the present invention are hereinafter described in detail.

The present invention creates induced charge due to piezo polarization and spontaneous polarization in the electron supply layer and forms a distribution of two-dimensional electron concentrations within a horizontal plane in accordance with the degree of the induced charge. Specifically, an Al content above a channel can be varied in the horizontal plane to adjust a portion of the channel under a high Al content area to have a high electron concentration and a portion of the channel under a low Al content area to have a low electron concentration. In this manner, the present invention provides a configuration for controlling piezo charge and spontaneous polarization effects within the plane to more effectively change a channel electron concentration partially within the plane. The configuration is utilized as required under a gate electrode, in a drift area, under an ohmic electrode, under a second gate electrode or the like, thereby realizing a gate with high withstand voltage, a low resistance contact and the like.

For example, at least two ore more AlGaN layers having different composition are disposed on an $In_xGa_{1-x}N$ ($1 \geqq X \geqq 0$) oriented on a (0001) surface to change a piezo effect and a spontaneous polarization effect within a plane, thereby making it possible to obtain a distribution of electron concentrations in the $InGa_x$ ($1 \geqq X \geqq 0$) layer within the plane. Such a configuration is realized by forming an AlGaN layer of an electron supply layer from two ore more layers having different Al contents and removing a portion of one of the layers through etching or forming it through selective growth.

Japanese Patent Laid-open Publication No. 11-261051 and Japanese Patent Laid-open Publication No. 11-274474 have made disclosure as to the possibility of increasing a two-dimensional electron concentration by changing composition of AlGaN serving as an electron supply layer in a thickness direction. Techniques disclosed in the publications, however, intend to improve electron mobility in a two-dimensional gas by changing the Al content in the thickness direction or to narrow an area in which a two-dimensional electron gas is formed. The publications do not disclose a configuration in which an Al content is varied within a horizontal plane perpendicular to a thickness direction, and an Al content within a horizontal plane is uniform in the disclosures. Particularly, it is the study by the present inventors that first revealed that an Al content above a channel can be varied within a horizontal, plane to adjust a portion of the channel under a high Al content area to have a high electron concentration and a portion of the channel under a low Al content area to have a low electron concentration.

The effects of the present invention are hereinafter described with reference to the drawings.

FIG. 6 is a cross section of a semiconductor device of the present invention in which at least two or more AlGaN layers 4, 5 with different composition formed on an $In_xGa_{1-x}N$ ($1 \geqq X \geqq 0$) layer vary a piezo effect within a plane to provide a distribution of electron concentrations in the $In_xGa_{1-x}N$ ($1 \geqq X \geqq 0$) layer within a plane. FIG. 8 is a schematic diagram showing a conduction band in area (a) near a channel from a surface below a source and a drain toward a substrate. FIG. 9 is a schematic diagram showing a conduction band in area (b) near a channel from a surface under a gate toward the substrate. An average Al content of the AlGaN layer present above the channel in area (a) is higher than an average Al content of the AlGaN layer present above the channel in area (b). As a result, in area (a), a greater piezo effect and a greater spontaneous polarization effect can be obtained to achieve carriers of a high electron density in the $In_xGa_{1-x}N$ ($1 \geqq X \geqq 0$) layer.

FIG. 7 shows a configuration of another example of a semiconductor device according to the present invention in which an AlGaN layer serving as an electron supply layer is formed of two ore more layers ($Al_{0.3}Ga_{0.7}N$ layer 4 and $Al_{0.1}Ga_{0.9}N$ layer 5) with different Al contents and one of the layers is removed partially through etching or formed through selective growth to vary a piezo effect within a plane, thereby obtaining a distribution of electron concentrations in $In_xGa_{1-x}N$ ($1 \geqq X \geqq 0$) layer 6 within a plane. $Al_{0.1}Ga_{0.9}N$ layer 5 is formed on GaN layer 6, and $Al_{0.3}Ga_{0.7}N$ layer 4 is formed on a portion of $Al_{0.1}Ga_{0.9}N$ layer 5. FIGS. 10 and 11 are schematic diagrams showing conduction bands near channels from a surface toward a substrate in area (c) including $Al_{0.3}Ga_{0.7}N$ layer 4 and area (d) including no $Al_{0.3}Ga_{0.7}N$ layer 4, respectively. In area (d) including no $Al_{0.3}Ga_{0.7}N$ layer 4, electrons are induced by a piezo effect and a spontaneous polarization effect induced by $Al_{0.1}Ga_{0.9}N$ layer 5 and in accordance a doping amount. On the other hand, in area (c) including $Al_{0.3}Ga_{0.7}N$ layer 4, a greater piezo effect and a greater spontaneous polarization effect can be obtained due to a high Al content in addition to a doped donor amount, and thus it is possible to provide carriers of a high electron density in GaN layer 6.

In an AlGaN/GaN HJFET configuration, a higher channel electron concentration is typically induced by a piezo effect than by doping. For this reason, in contrast with a conventional uniform AlGaN layer as shown in FIG. 1, the configuration including partially different AlGaN contents within a plane is employed as shown in FIG. 6, or a strain layer with a high Al content is provided to cause a great piezo effect which results in a large difference from a portion including no strain layer as shown in FIG. 7. According to the present invention, a large difference in channel electron concentration can be obtained in a horizontal direction along the surface of the device to simultaneously form a high resistance area and a low resistance area in a conduction layer with a small difference in height, resulting in a desired channel electron concentration depending on areas. When an area in a low channel electron concentration is used under a gate electrode or in a drift area between a gate and drain, high gate withstand voltage can be realized. On the other hand, a layer in a high channel electron concentration can be formed under an ohmic electrode, or a high channel electron concentration can be extended to a portion near an ohmic electrode. With the configuration, resistors with largely different values can be formed on the same substrate by using a channel layer.

As described above, according to the present invention, since an area in a high electron concentration and an area in a low electron concentration can be separately formed within a plane with a wide difference in concentration, the low electron concentration can be provided for a region requiring high withstand voltage and the high electron concentration can be provided for a region requiring low contact resistance. Thus, the design of a device configuration is facilitated since it is possible to separately form an area which positively utilizes a piezo effect and a spontaneous polarization effect and an area which does not make much use of such effects, and moreover, device characteristics are dramatically improved. The ability to form a conduction layer with largely different resistance values within the same plane is advantages in terms of circuit configuration. The small difference in height also facilitates the process.

As described above, according to the present invention, a distribution of two-dimensional electron concentrations is formed in accordance with a distribution of induced charge including piezo charge within a horizontal plane. It is thus possible to form an area of high channel resistance and an area of low channel resistance with a small difference in height. When the present invention is applied to a transistor configuration, withstand voltage between a gate and a drain is improved by reducing a channel concentration under the gate, while low contact resistance can be realized by increasing a channel concentration in source and drain areas. When the present invention is applied to a monolithic microwave integrated circuit, a higher resistance element and a lower resistance element can be separately formed with simple steps and good controllability. The ability to simultaneously form a conduction layer with largely different channel resistance within the same plane is also advantageous in terms of circuit configuration.

DESCRIPTION OF THE PREFERRED EMBODIMENT

In the present invention, each III nitride semiconductor layer constituting a semiconductor device is preferably a wurtzite semiconductor layer having a (0001) surface as its main surface because it can exert a sufficient piezo effect. However, various forms may be employed as long as a predetermined piezo effect is produced, and for example, an inclination of approximately 55 degrees or less, preferably 10 degrees or less, may be made from the (0001) surface toward an arbitrary direction.

When a semiconductor layer with a lattice constant different from that of an underlying layer is formed on the layer, dislocation occurs in the semiconductor layer to produce lattice relaxation if the thickness is equal to or larger than a critical thickness. It is thus preferable that the thickness of the semiconductor layer is smaller than the critical thickness for sufficiently producing piezo polarization to achieve clear effects of the present invention. However, the lattice relaxation generally develops incompletely, and certain lattice strain remains even with a thickness greater than the critical thickness. Accordingly, the present invention may employ a thickness exceeding the critical thickness as long as a predetermined piezo effect is produced.

Figure 4:
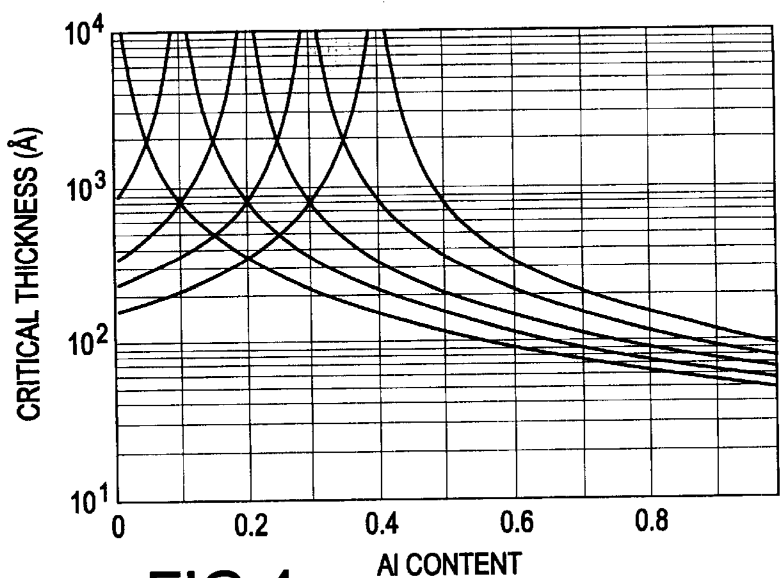
FIG. 4 is a graph showing calculation results of a critical thickness.
Figure 5:
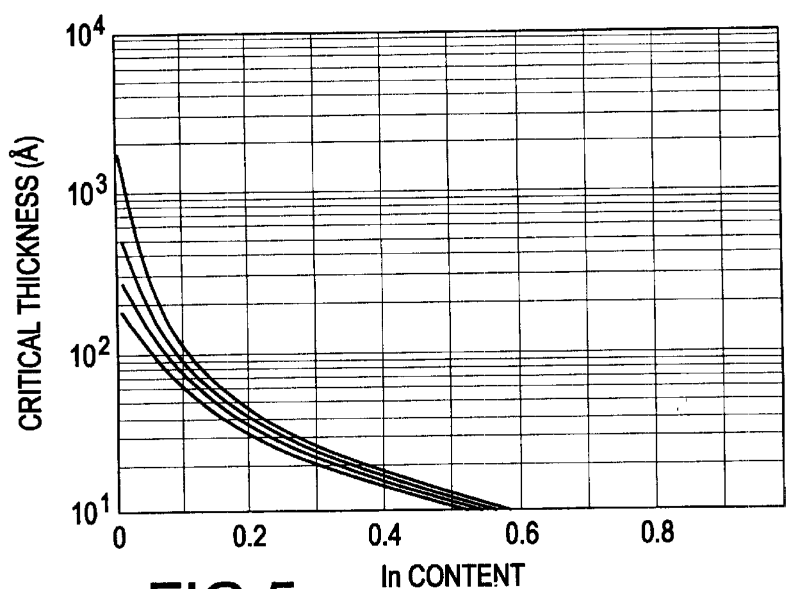
FIG. 5 is a graph showing calculation results of a critical thickness.

The critical thickness can be calculated by the Matthews' formula (J. W. Matthews and A. E. Blakeslee, J. Cryst. Growth 27, 118 (1974)). FIGS. 4 and 5 show the calculation results. In the calculations, parameters shown in the following tables were used.

TABLE 1

| | GaN | AlN | InN |
|---|---|---|---|
| lattice constant (Å) | 3.180 | 3.111 | 3.533 |
| Poisson's ratio | 0.3 | 0.3 | 0.3 |

As described above, each layer constituting the semiconductor device of the present invention desirably has a thickness smaller than the critical thickness, but limitations are not imposed particularly on a lower limit of the thickness, and for example, a thickness (approximately 10 Å) of stacked layers of the order of several atoms may be used.

In the present invention, an electron supply layer and a strain layer have tensile strain. Such a configuration can be realized by using the electron supply layer having an average lattice constant smaller than an average lattice constant of the thickest underlying layer of semiconductor layers constituting the semiconductor device. The underlying layer restrains the crystal systems of the other semiconductor layers, and strain modes of the other semiconductor layers are determined with reference to the layer. Specifically, tensile stress is produced in a layer having a lattice constant smaller than that of the underlying layer, while compressive stress is produced in a layer having a lattice constant larger than that of the underlying layer.

The average lattice constant does not refer to an interstitial spacing in the state of a multilayer but to a lattice constant inherent in a material constituting a layer and is equal to an average value of lattice constants in a horizontal plane perpendicular to a thickness direction. For example, when an AlGaN layer with an a axis lattice constant smaller than that of GaN is grown on a thick underlying layer formed of GaN including a (0001) surface as a main surface, tensile strain occurs in the AlGaN layer, and the GaN layer and AlGaN layer have equal interstitial spacings in a horizontal plane perpendicular to a thickness direction. The average lattice constant in the present invention does not refer to such interstitial spacings under strain but to a lattice constant inherent in the material. The lattice constant in the horizontal plane perpendicular to the thickness direction coincides with the a axis lattice constant when no inclination is made from the (0001) surface.

An active layer is preferably configured to have no strain or compressive strain. This can cause a piezo effect or a spontaneous polarization effect by lattice mismatching between the active layer and electron supply layer to preferably induce channel electrons in the active layer.

As specific materials of the active layer and electron supply layer, it is preferable that the active layer is formed of lattice relaxation crystal made of $In_xGa_{1-x}N$ ($1 \geqq X \geqq 0$) with a (0001) surface as a main surface, and on this layer, AlGaN is formed at a thickness smaller than the critical thickness. In this case, tensile stress is applied to AlGaN in a horizontal direction to produce piezo charge in the thickness direction of the epitaxial layer. From a macroscopic viewpoint, in AlGaN, positive charge is produced in a portion closer to $In_xGa_{1-x}N$ while negative charge is produced in a portion closer to the surface. As a result, a distribution of two-dimensional electron concentrations is formed within a horizontal plane perpendicular to the thickness direction.

In the present invention, the electron supply layer and strain layer can be formed to have an Al content increasing with distance from the active layer. In this case, the increase may be made in various manners such as a stepped increase or a continuous increase.

When the semiconductor device of the present invention is applied to a monolithic microwave integrated circuit comprising a higher resistance element and a lower resistance element or the like, the semiconductor device is typically configured to have two or more ohmic electrodes on an electron supply layer.

EXAMPLE 1 (not shown)

Figure 1:
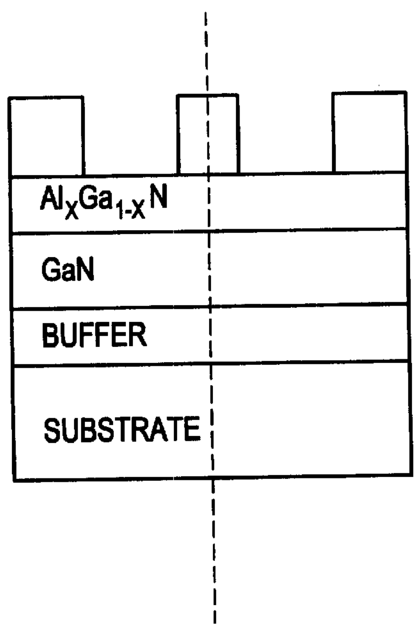
FIG. 1 is a schematic diagram showing an example of a conventional semiconductor device.
Figure 2:
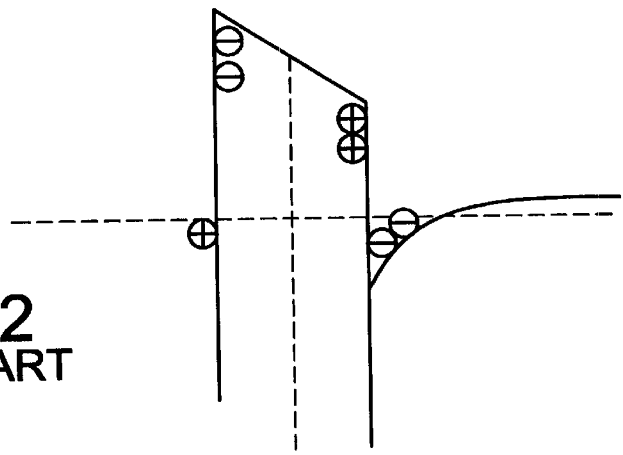
FIG. 2 is a schematic diagram for explaining a band structure of the conventional semiconductor device.
Figure 3:
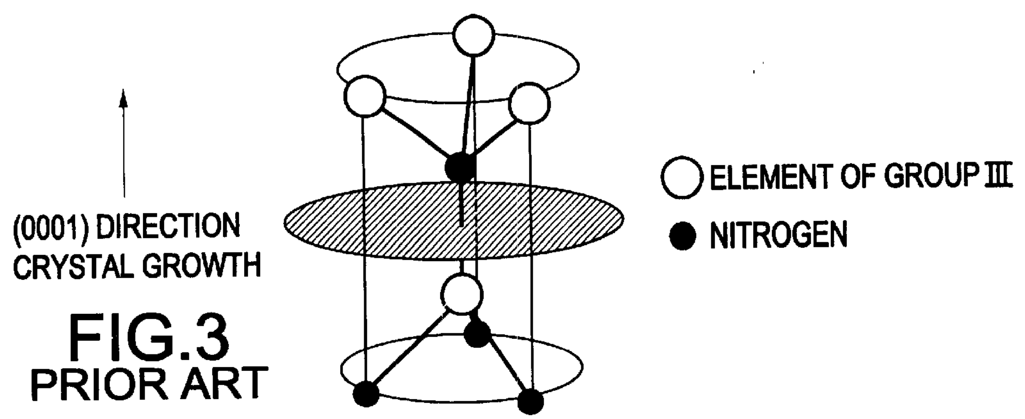
FIG. 3 is a schematic diagram showing a crystal structure of a wurtzite III nitride semiconductor.
Figure 8:
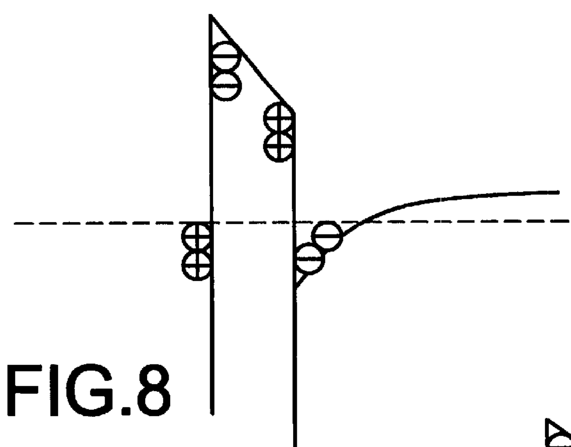
FIG. 8 is a schematic diagram for explaining a band structure of the semiconductor device according to the present invention.
Figure 9:
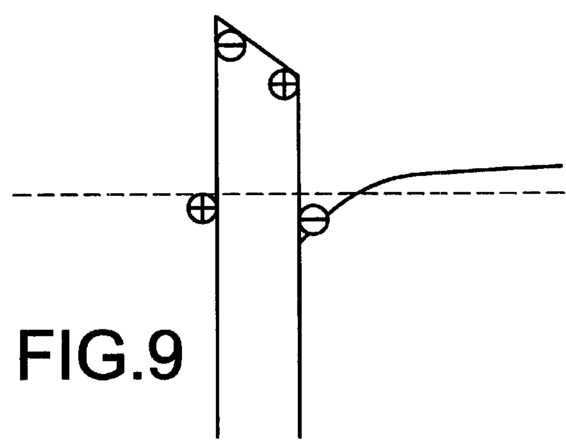
FIG. 9 is a schematic diagram for explaining a band structure of the semiconductor device according to the present invention.

A GaN buffer layer of a thickness of 3 nm oriented on (0001) is formed on a substrate through an MOCVD process. On this layer, a non-doped $In_{0.1}Ga_{0.9}N$ layer serving as a channel layer (active layer) is grown at a thickness of 15 nm. On this layer, an $Al_{0.3}Ga_{0.7}N$ layer doped with Si at $6 \times 10^{18}$ $cm^{-3}$ is grown at a thickness of 10 nm as an electron supply layer. An $SiO_2$ film or SiN film is formed thereon, and a portion thereof is removed by using a photoresist as a mask. The $SiO_2$ film or SiN film is used as a mask to remove a portion of the $Al_{0.3}Ga_{0.7}N$ layer through dry etching with RIE (Reactive Ion Etching) by using a $Cl_2$ gas. In the removed portion, an $Al_{0.1}Ga_{0.9}N$ layer doped with Si at $4 \times 10^{18}$ $cm^{-3}$ is selectively fromed at a thickness of 10 nm through the MOCVD process. In general, a band diagram of a cross section of an element with uniform composition is as shown in FIG. 2, while a band diagram of AlGaN with nonuniform composition is as shown in FIG. 8. The present invention allows a larger strain to achieve a larger difference in carrier concentration as compared with the conventional case where recess etching is performed on uniform composition to form a difference in height. Ti at a thickness of 10 nm and Al at a thickness of 200 nm are formed and annealed as source and drain electrodes, respectively, on portions of the AlGaN layer with the high Al content to provide ohmic contact electrodes, while Ni at a thickness of 10 nm and Au at a thickness of 200 nm are formed as a gate electrode on a portion of the AlGaN layer with a low Al content. The provision of the configuration enables both improvement in withstand voltage between a gate and a drain and realization of low contact resistance in the same device. The AlGaN layer doped with Si at $2 \times 10^{18}$ $cm^{-3}$ may be configured to have an Al content increasing stepwise or continuously. The channel layer may be formed of GaN. The example may employ a sapphire substrate, an SiC substrate or a GaN substrate as long as the GaN layer serving as the buffer layer and InGaN serving as the active layer are oriented on (0001).

EXAMPLE 2

Figure 7:
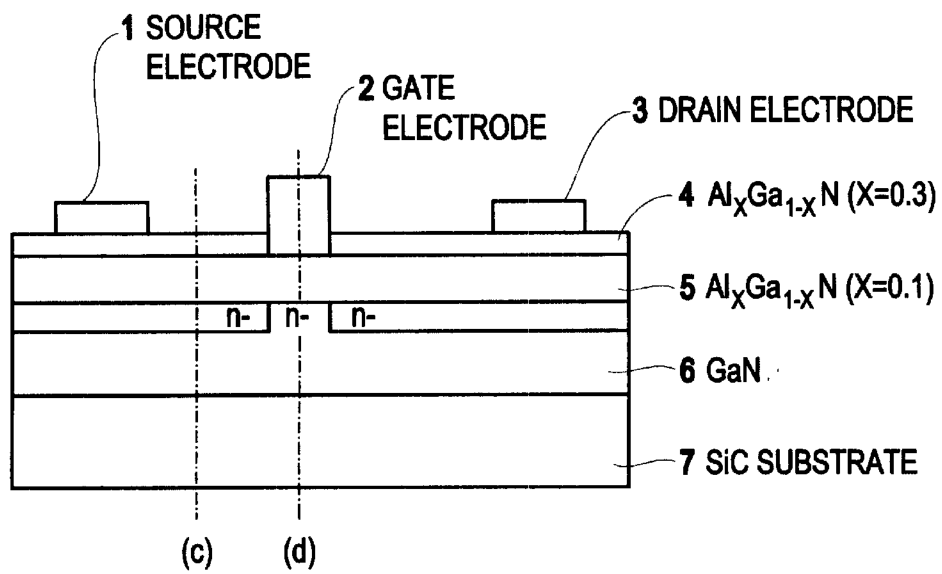
FIG. 7 is a schematic diagram showing an example of a semiconductor device according to the present invention.
Figure 10:
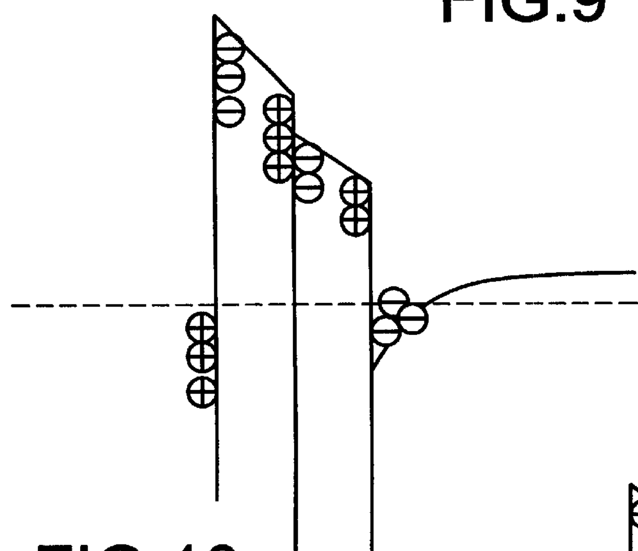
FIG. 10 is a schematic diagram for explaining a band structure of the semiconductor device according to the present invention.
Figure 11:
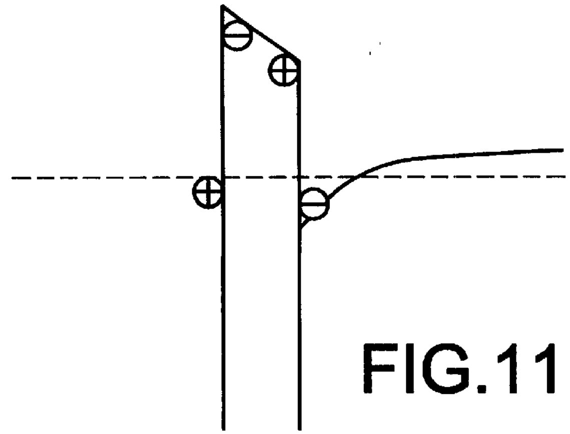
FIG. 11 is a schematic diagram for explaining a band structure of the semiconductor device according to the present invention.
Figure 12:
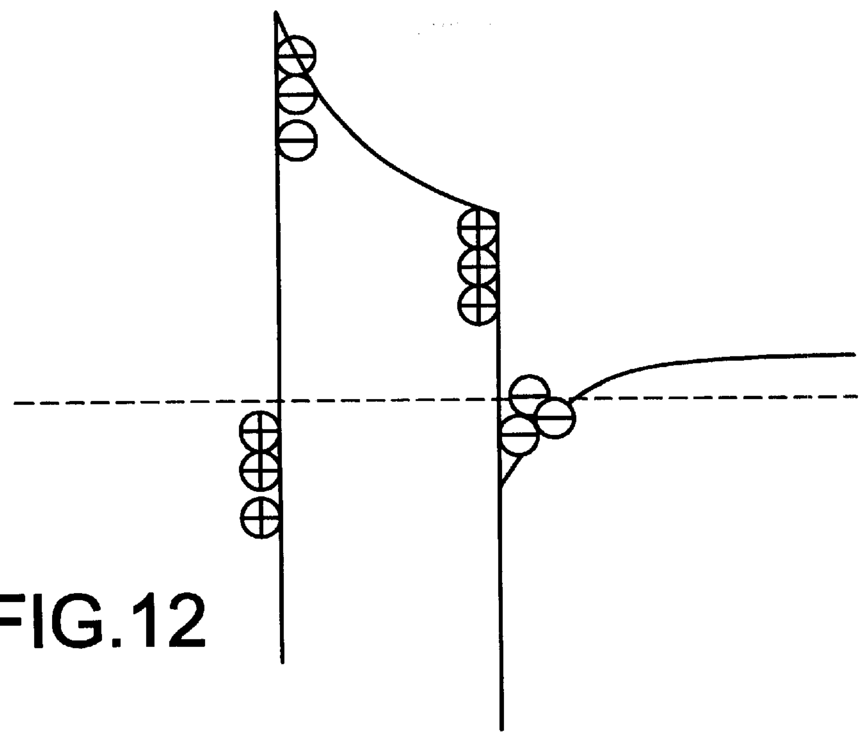
FIG. 12 is a schematic diagram for explaining a band structure of a semiconductor device according to the present invention.

Referring to FIG. 7, a GaN buffer layer of a thickness of 3 nm oriented on (0001) is formed on an SiC substrate through an MOCVD process. A non-doped GaN layer serving as a channel layer is formed thereon at a thickness of 15 nm. An $Al_{0.1}Ga_{0.9}N$ layer doped with Si at $2\times10^{18}$ $cm^{-3}$ is grown at a thickness of 10 nm, and an $Al_{0.3}Ga_{0.7}N$ layer doped with Si at $4\times10^{18}$ $cm^{-3}$ is formed at a thickness of 10 nm on the $Al_{0.1}Ga_{0.9}N$ layer. A portion of the $Al_{0.3}Ga_{0.7}N$ is patterned with an oxide film as a mask by using a $BCl_3$ gas and a $SF_6$ gas through ICP (Inductively Coupled Plasma) and selectively removed through dry etching. Alternatively, on the $Al_{0.1}Ga_{0.9}N$ layer doped with Si at $2\times10^{18}$ $cm^{-3}$, an $Al_{0.3}Ga_{0.7}N$ layer doped with Si at $4\times10^{18}$ $cm^{-3}$ is selectively formed by using $SiO_2$ as a mask through the MOCVD process or the like. A band diagram of a cross section of a portion with no recess etching is as shown in FIG. 10, while a band diagram of a portion with recess etching is shown in FIG. 11. In the present invention, since the Al content in the portion with no recess is higher than the Al content in the portion with recess, a greater strain can be provided to obtain a large difference in carrier concentration due to a piezo effect as compared with the conventional case where recess etching is performed on uniform composition to form a difference in height. Ni at a thickness of 10 nm and Au at a thickness of 200 nm are embedded as a gate electrode in the recessed portion, while Ti at a thickness of 10 nm and Al at a thickness of 200 nm are formed as source and drain electrodes, respectively, on the portion with no recess. The provision of the configuration enables both improvement in withstand voltage between a gate and a drain and realization of low contact resistance in the same device. The $Al_{0.3}Ga_{0.7}N$ layer doped with Si at $4\times10^{18}$ $cm^{-3}$ may be configured to have an Al content increasing from 0.2 to 0.5 continuously. The channel layer may be formed of InGaN.

EXAMPLE 3

Figure 13:
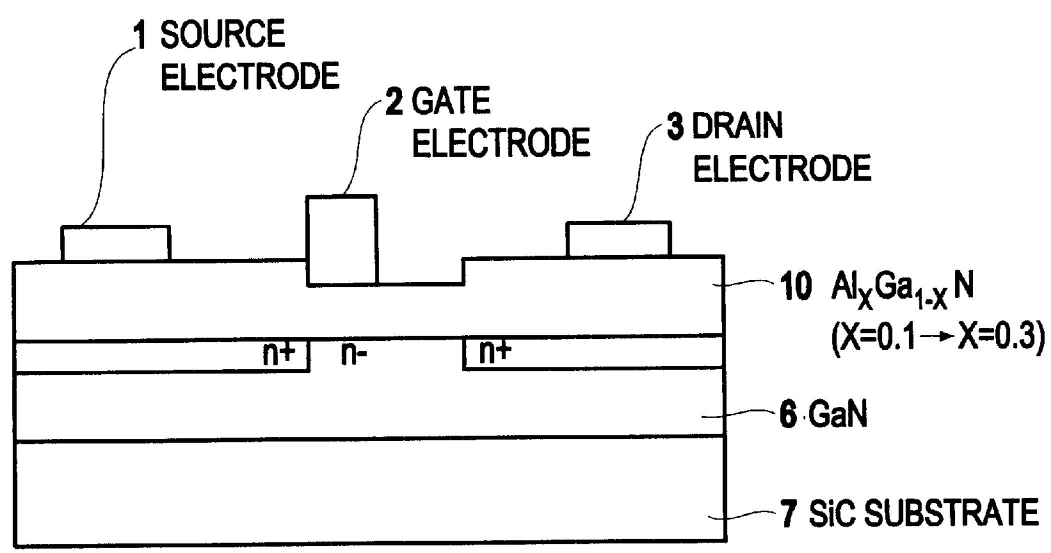
FIG. 13 is a schematic diagram showing an example of a semiconductor device according to the present invention.

FIG. 13 shows a configuration of an FET according to Example 3. GaN layer 6 and $Al_xGa_{1-x}N$ layer 10 are formed on SiC substrate 7, and source electrode 1, gate electrode 2, and drain electrode 3 are formed thereon. GaN layer 6 serves as an active layer, and $Al_xGa_{1-x}N$ layer 10 serves as an electron supply layer.

After the formation of $Al_xGa_{1-x}N$ layer 10 (X continuously increases from 0.1 to 0.3) having a uniformly increasing Al content, a portion thereof is etched to form a recess. Gate electrode 2 is formed on part of the recessed portion such that a recess portion exists between gate electrode 2 and drain electrode 3. A drift area between the gate and source is also recessed to achieve further improvement in gate withstand voltage.

Figure 6:
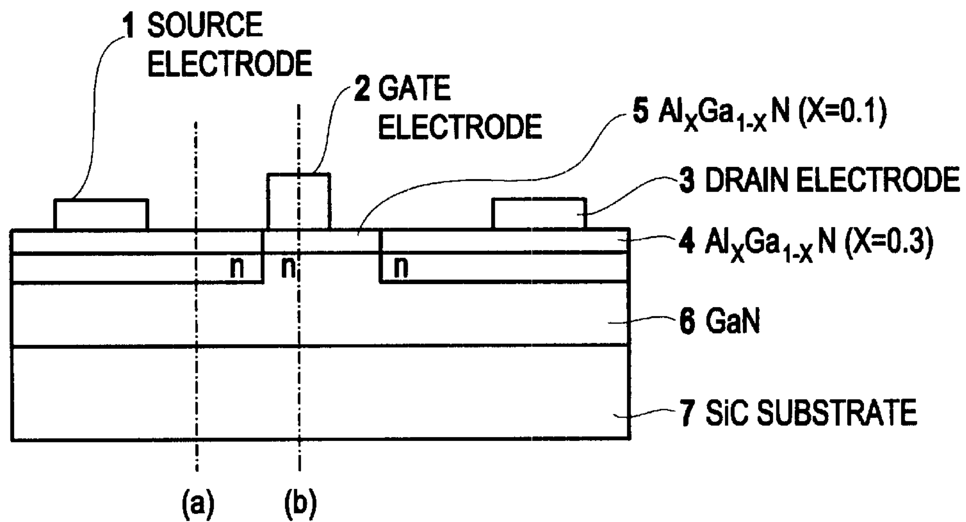
FIG. 6 is a schematic diagram showing an example of a semiconductor device according to the present invention.

When the aforementioned configuration is applied to the form shown in FIG. 6, AlGaN layer 5 with a low Al content is extended long toward the drain and the gate is formed thereon close to the source.

EXAMPLE 4

Figure 14:
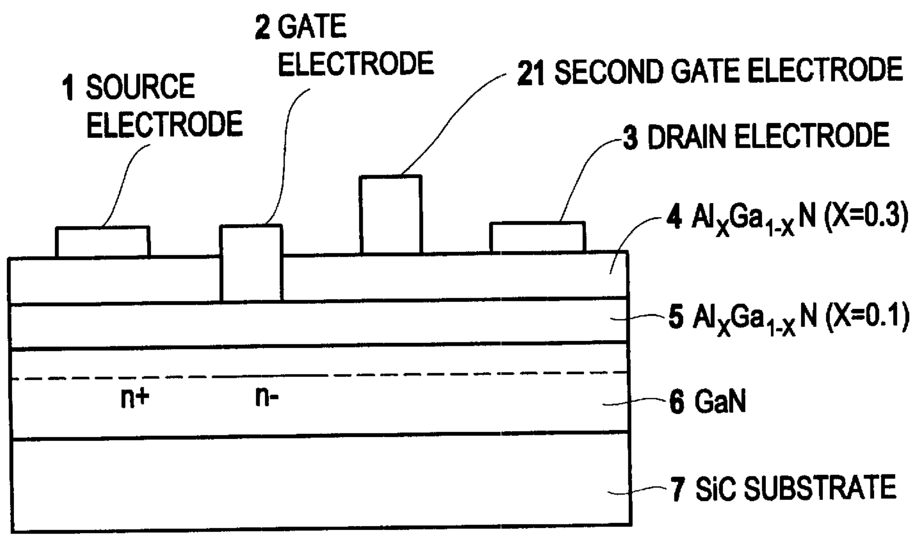
FIG. 14 is a schematic diagram showing an example of a semiconductor device according to the present invention.

FIG. 14 shows a configuration of an FET according to Example 4. GaN layer 6, $Al_{0.1}Ga_{0.9}N$ layer 5, and $Al_{0.3}Ga_{0.7}N$ layer 4 are formed on SiC substrate 7, and source electrode 1, gate electrode 2, drain electrode 3, and gate electrode 21 are formed thereon. GaN layer 6 serves as an active layer and $Al_{0.1}Ga_{0.9}N$ layer 5 serves as an electrode supply layer, and $Al_{0.3}Ga_{0.7}N$ layer 4 corresponds to a strain layer in the present invention.

Example 4 is related to a dual gate FET. As shown in FIG. 14, gate electrode 2 is formed on a recess portion and second gate electrode 21 is formed between gate electrode 2 and drain electrode 3. Second gate electrode 21 is formed on a portion with no recess. The two gates with different threshold voltages are formed in a cascode connection to allow improvement in withstand voltage and a reduction in drain conductance.

When the aforementioned configuration is applied to the form shown in FIG. 6, the same effects can be obtained by providing the first gate on AlGaN layer 5 with a low Al content and providing the second gate on AlGaN layer 4 with a high Al content between the gate and drain.

EXAMPLE 5

Figure 15:
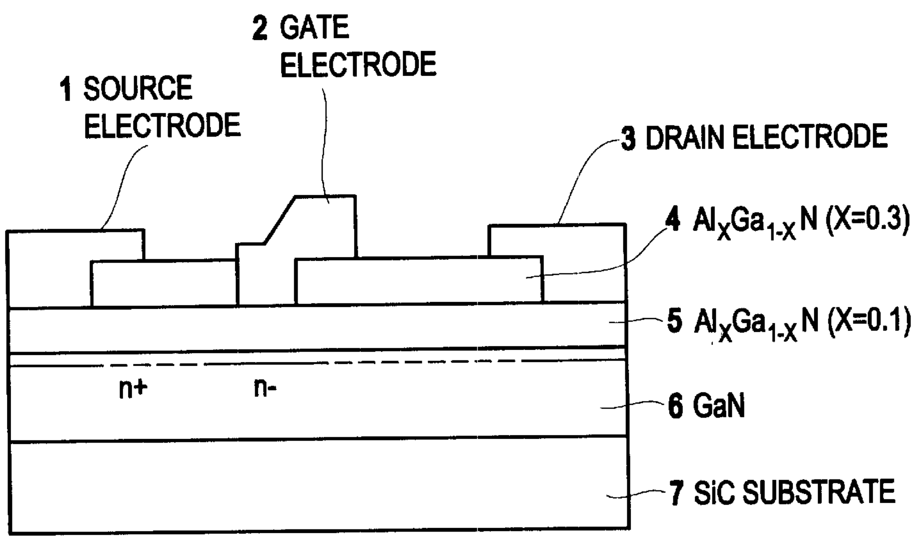
FIG. 15 is a schematic diagram showing an example of a semiconductor device according to the present invention.

FIG. 15 shows a configuration of an FET according to Example 5. GaN layer 6, $Al_{0.1}Ga_{0.9}N$ layer 5, and $Al_{0.3}Ga_{0.7}N$ layer 4 are formed on SiC substrate 7, and source electrode 1, gate electrode 2, and drain electrode 3 are formed thereon. GaN layer 6 serves as an active layer and $Al_{0.1}Ga_{0.9}N$ layer 5 serves as an electrode supply layer, and $Al_{0.3}Ga_{0.7}N$ layer 4 corresponds to a strain layer in the present invention.

When gate electrode 2 is formed to extend on a portion with recess and on a portion with no recess as in Example 5, it is possible to improve withstand voltage and to reduce drain conductance similarly to the case where the gates in a cascode connection are short-circuited in Example 4. When the configuration is applied to the form in FIG. 6, the same effects can be obtained by providing the gate to extend on AlGaN layer 5 with a low Al content and on AlGaN layer 4 with high an Al content.

In Example 5, $Al_{0.3}Ga_{0.7}N$ layer 4 (stain layer) is formed to be in contact with the source electrode and drain electrode. Thus, a low resistance area under the strain layer is close to the source electrode and drain electrode to allow a reduction in contact resistance.

When the aforementioned configuration is applied to the form shown in FIG. 6, the same effects can be obtained by forming the source electrode or drain electrode to extend on AlGaN layer 5 with a low AL content and on $Al_{0.3}Ga_{0.7}N$ layer 4 with a high Al content.

EXAMPLE 6

Figure 16:
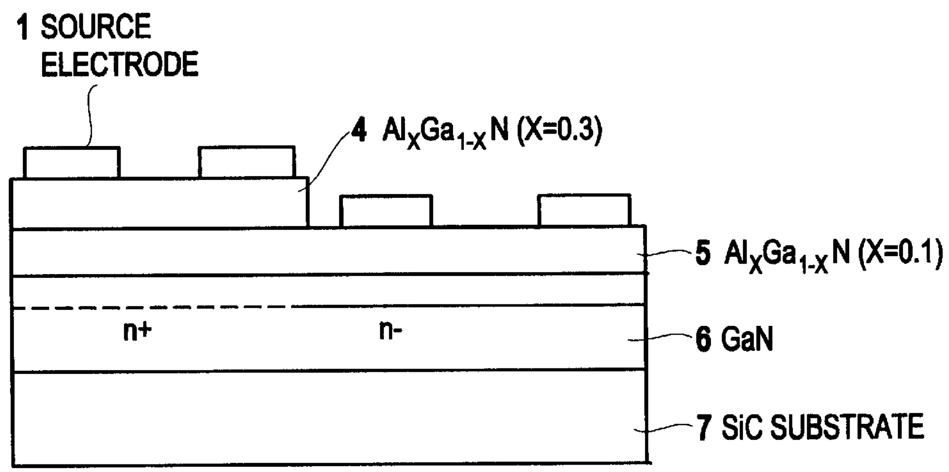
FIG. 16 is a schematic diagram showing an example of a semiconductor device according to the present invention.
Figure 17:
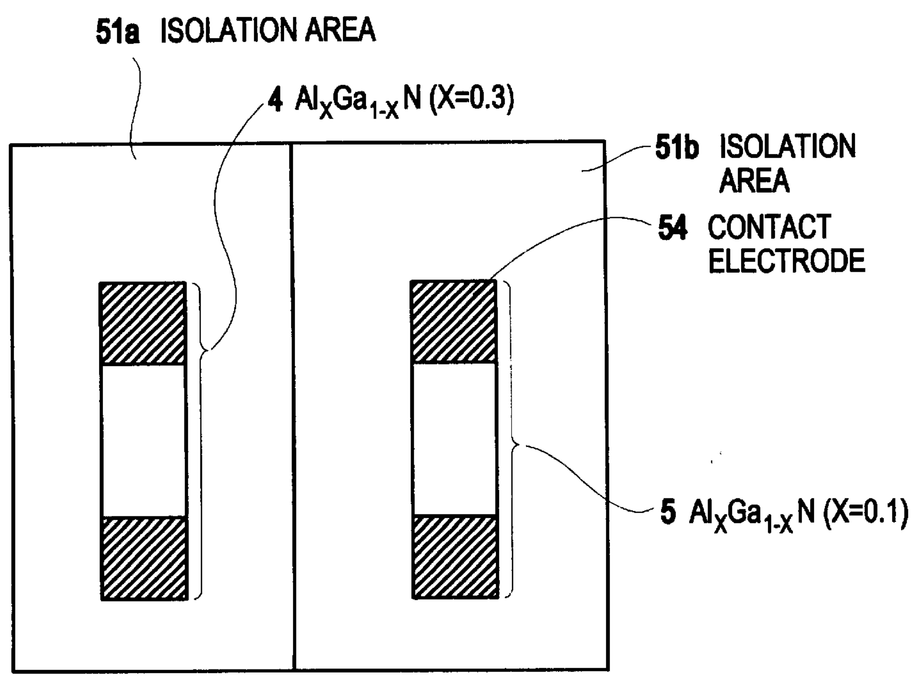
FIG. 17 is a schematic diagram showing an example of a semiconductor device according to the present invention.

FIG. 16 (cross section) and FIG. 17 (top view) show examples where the present invention is applied to a monolithic microwave integrated circuit. In this Example, a high two-dimensional electron concentration is obtained due to the presence of $Al_{0.3}Ga_{0.7}N$ layer 4 (strain layer) in a portion with no recess. This portion is used as a lower resistance element. On the other hand, in a recessed portion, a two-dimensional electron concentration is relatively low due to the absence of $Al_{0.3}Ga_{0.7}N$ layer 4. This portion is used as a higher resistance element.

According to this Example, since passive circuits with largely different resistance values are formed on the same substrate without a large difference in shape, this Example is simple and advantageous in terms of circuit design and process, and moreover, enables a reduction in area where resistors are formed.

The application of the aforementioned configuration to the form shown in FIG. 6 can be realized by forming contact layers on the AlGaN layers having different composition, respectively.

What is claimed is:

1. A semiconductor device, comprising:

an active layer; and an electron supply layer in which induced charge including piezo charge is produced, said active layer and said electron supply layer being stacked in this order and having an interface between them at which a two-dimensional electron gas is formed, wherein said induced charge has a substantially nonuniform distribution within a horizontal plane perpendicular to a thickness direction of said active layer and said electron supply layer and a distribution of a two-dimensional electron concentrations is formed within said horizontal plane in accordance with said substantially nonuniform distribution of said induced charge.

2. The semiconductor device according to claim 1, further comprising:

a gate electrode;

a source electrode; and a drain electrode, wherein a first area having a relatively low two-dimensional electron concentration is formed under said gate electrode and a second area having a relatively high two-dimensional electron concentration is formed under at least one of said source electrode, said drain electrode, an area between said gate electrode and said drain electrode, and an area between said gate electrode and said source electrode.

3. The semiconductor device according to claim 2, wherein said first area having a relatively low two-dimensional electron concentration comprises a higher resistance element and said second area having a relatively high two-dimensional electron concentration comprises a lower resistance element.

4. A semiconductor device, comprising:

an active layer, said active layer comprising $In_x\ Ga_{1-x}N$ $(1 \geqq X \geqq 0)$; and an electron supply layer formed in contact with an upper portion of said active layer and having a substantially nonuniform tensile strain within a horizontal plane perpendicular to a thickness direction of said electron supply layers said electron supply layer including a plurality of AlGaN layers, each of said plurality of AlGaN layers having a different average Al content.

5. The semiconductor device according to claim 4, wherein an Al content of at least one of said plurality of AlGaN layers increases with distance from said active layer.

6. The semiconductor device according to claim 4, further comprising:

a gate electrode;

a source electrode; and a drain electrode, wherein said gate electrode contacts one of said plurality of AlGaN layers, and other layers of said plurality of AlGaN layers have a higher Al content than said one of said plurality of AlGaN layers and are disposed between said gate electrode and said drain electrode and between said gate electrode and said source electrode.

7. The semiconductor device according to claim 5, further comprising:

a gate electrode;

a source electrode; and a drain electrode, wherein said gate electrode contacts one of said plurality of AlGaN layers, and other layers of said plurality of AlGaN layers have a higher Al content than said one of said plurality of AlGaN layers and are disposed between said gate electrode and said drain electrode and between said gate electrode and said source electrode.

8. The semiconductor device according to claim 4, wherein an area where a layer of said plurality of AlGaN layers having a relatively low Al content forms a higher resistance element and an area where a layer of said plurality of AlGaN layers having a relatively high Al content forms a lower resistance element.

9. The semiconductor device according to claim 5, wherein an area where a layer of said plurality of AlGaN layers having a relatively low Al content forms a higher resistance element and an area where a layer of said plurality of AlGaN layers having a relatively high Al content forms a lower resistance element.

10. A semiconductor device, comprising:

an active layer;

an electron supply layer formed in contact with an upper portion of said active layer and having a substantially nonuniform tensile strain; and a strain layer formed in contact with a part of an upper portion of said electron supply layer and having a corresponding substantially nonuniform tensile strain, wherein said active layer comprises $In_xGa_{1-x}N$ $(1 \geqq X \geqq 0)$, said electron supply layer comprises $Al_YGa_{1-Y}N$ $(Y \geqq 0)$, and said strain layer comprises $Al_ZGa_{1-Z}N$ $(1 \geqq Z > Y)$.

11. The semiconductor device according to claim 10, wherein an Al content in at least one of said electron supply layer and said strain layer increase with distance from said active layer.

12. The semiconductor device according to claim 10, further comprising:

a gate electrode;

a source electrode; and a drain electrode, wherein said gate electrode contacts said electron supply layer, and said strain layer is disposed between said gate electrode and said drain electrode and between said gate electrode and said source electrode.

13. The semiconductor device according to claim 11, further comprising:

a gate electrode;

a source electrode; and a drain electrode, wherein said gate electrode contacts said electron supply layer, and said strain layer is disposed between said gate electrode and said drain electrode and between said gate electrode and said source electrode.

14. The semiconductor device according to claim 10, wherein an area where said strain layer is disposed forms a lower resistance element and an area where said strain layer is not disposed forms a higher resistance element.

15. The semiconductor device according to claim 11, wherein an area where said strain layer is disposed forms a lower resistance element and an area where said strain layer is not disposed forms a higher resistance element.

16. A semiconductor device, comprising:

an active layer; and an electron supply layer formed in contact with an upper portion of said active layer and having a tensile strain, wherein an Al content in said electron supply layer increases with distance from said active layer, a first area having a relatively low Al content is formed at a lower surface of said electron supply layer, and a second area having a relatively high Al content is formed at an upper surface of said electron supply layer.

17. The semiconductor device according to claim 16, further comprising:

a gate electrode;

a source electrode; and a drain electrode, wherein said gate electrode contacts said first area, and said second area is formed under at least one of said source electrode, said drain electrode, an area between said gate electrode and said drain electrode, and an area between said gate electrode and said source electrode.

18. The semiconductor device according to claim 16, wherein said first area comprises a higher resistance element and said second area comprises a lower resistance element.

19. The semiconductor device according to claim 2, further comprising a second gate electrode between said gate electrode and said drain electrode.

20. The semiconductor device according to claim 6, further comprising a second gate electrode between said gate electrode and said drain electrode.

21. The semiconductor device according to claim 7, further comprising a second gate electrode between said gate electrode and said drain electrode.

22. The semiconductor device according to claim 12, further comprising a second gate electrode between said gate electrode and said drain electrode.

23. The semiconductor device according to claim 13, further comprising a second gate electrode between said gate electrode and said drain electrode.

24. The semiconductor device according to claim 17, further comprising a second gate electrode between said gate electrode and said drain electrode.

* * * * *